United States Patent
Lin

(10) Patent No.: US 7,224,584 B2
(45) Date of Patent: May 29, 2007

(54) MINIATURIZED FAN MODULE

(75) Inventor: Shu-Ju Lin, Taipei (TW)

(73) Assignee: Inventec Corporation, Taipei (TW)

( * ) Notice: Subject to any disclaimer, the term of this patent is extended or adjusted under 35 U.S.C. 154(b) by 199 days.

(21) Appl. No.: 11/090,226

(22) Filed: Mar. 28, 2005

(65) Prior Publication Data

US 2006/0039109 A1    Feb. 23, 2006

(30) Foreign Application Priority Data

Aug. 18, 2004    (TW) .............................. 93213132 U

(51) Int. Cl.
*H05K 7/20*    (2006.01)
(52) U.S. Cl. ............... 361/695; 415/213.1; 417/423.15
(58) Field of Classification Search ........ 361/694–695; 415/213.1, 220; 417/423.15
See application file for complete search history.

(56) References Cited

U.S. PATENT DOCUMENTS

| | | | | |
|---|---|---|---|---|
| 3,204,546 A | * | 9/1965 | Krell ........................... | 454/272 |
| 4,568,243 A | * | 2/1986 | Schubert et al. ......... | 415/213.1 |
| 5,208,730 A | * | 5/1993 | Tracy ......................... | 361/687 |
| 5,788,566 A | * | 8/1998 | McAnally et al. .......... | 454/184 |

* cited by examiner

*Primary Examiner*—Greg Thompson
(74) *Attorney, Agent, or Firm*—Birch, Stewart, Kolasch & Birch, LLP

(57) ABSTRACT

A miniaturized fan module can be accommodated in an electronic system (such as a server) to provide heat dissipation. The miniaturized fan module has a smaller structural size than that of a conventional fan module, such that a larger bump-preventing buffer space between the miniaturized fan module and a framework of the server is provided for preventing the fan module from bumping against the server framework due to vibration generated in practical operation, without degrading a heat dissipating effect and structural strength of the fan module.

6 Claims, 4 Drawing Sheets

US 7,224,584 B2

MINIATURIZED FAN MODULE

FIELD OF THE INVENTION

The present invention relates to mechanical technologies, and more particularly, to a miniaturized fan module, which can be assembled to a framework of an electronic system (for example a 1U server) to provide a fan-type heat dissipating function; the miniaturized fan module has a smaller structural size than that of a conventional fan module, such that a larger bump-preventing buffer space between the miniaturized fan module and the a framework of the electronic system is provided for preventing the fan module from bumping against the framework of the electronic system due to vibration generated in practical operation.

BACKGROUND OF THE INVENTION

A conventional electronic system (for example a server) is usually equipped with a fan module for dissipating heat generated from inner circuit components (for example central processing unit) using wind power to thereby prevent the inner circuit components from failure by being overheated.

FIG. 1 shows a schematic cross-sectional view of a conventional fan module 100 assembled to a server framework 10. As shown in FIG. 1, the conventional fan module 100 comprises an outer frame 110 and a fan unit 120, wherein the outer frame 110 in cross-section is substantially square-shaped, and a cylinder-shaped fan accommodating space 111 is formed in the outer frame 110 for accommodating the fan unit 120.

As shown in FIG. 1, in a practical embodiment, a height of a space provided by the server framework 10 for accommodating the fan module 100 is about 40.5 mm, a length of a side of the square-shaped outer frame 110 in cross-section is about 40 mm, and a diameter of the cylinder-shaped fan accommodating space 111 is about 38 mm, such that the maximum length of a fan of the fan unit 120 can only be 19 mm, and a distance between a top surface 110a or bottom surface 110b of the outer frame 110 of the fan module 100 and the server framework 10 is only 0.25 mm.

In practical implementation, the foregoing fan module 100 causes a drawback that since the distance between the top surface 110a or bottom surface 110b of the outer frame 110 and the server framework 10 is only 0.25 mm, this fails to provide a sufficient bump-preventing buffer space between the fan module 100 and the server framework 10 such that the fan module 100 is apt to bump against the server framework 10 due to up and down vibration generated in practical operation. This may cause internal vibration of the server and affect operation of internal delicate components of the server.

A solution to the above problem is to shorten the fan length of the fan unit 120 of the fan module 100, such that the side of the square cross-section of the outer frame 110 can be reduced in length to increase the distance between the top surface 110a or bottom surface 110b of the outer frame 110 and the server framework 10, thereby enlarging the bump-preventing buffer space. However, such method would undesirably degrade a heat dissipating effect provided by the fan module 100.

Another solution to the above problem is to reduce the thickness of the top surface 110a and the bottom surface 110b of the fan module 100, so as to reduce the height of the cross-section of the outer frame 110 and increase the distance between the top surface 110a or bottom surface 110b of the outer frame 110 and the server framework 10. However, such method would undesirably reduce the structural strength of the outer frame 110, making the fan module apt to be damaged by an external force.

SUMMARY OF THE INVENTION

In light of the foregoing drawbacks in the prior art, a primary objective of the present invention is to provide a miniaturized fan module, which has a larger bump-preventing buffer space between an outer frame thereof and a server framework, without degrading a heat dissipating effect and structure strength of the outer frame.

In order to achieve the above and other objectives, the present invention proposes a miniaturized fan module that is assembled to a framework of an electronic system (such as a 1U server), for providing a fan-type heat dissipating function to the server.

The miniaturized fan module in the present invention comprises: (a) a pair of outer frames, each of the outer frames comprising a first surface and a second surface, wherein an inner wall is formed between the first surface and the second surface of each of the outer frames, and the two outer frames are spaced apart by a predetermined distance face to face to cooperatively form a fan accommodating space between the inner walls thereof; (b) a pair of strengthening members respectively secured to the first surfaces and the second surfaces of the two outer frames to bridge the outer frames, such that the two outer frames are coupled together by the strengthening members; and (c) a fan unit disposed in the fan accommodating space formed between the outer frames coupled together by the strengthening members, so as to provide winds.

The miniaturized fan module in the present invention has a smaller structural size than that of a conventional fan module, such that a larger bump-preventing buffer space between the miniaturized fan module and the server framework is provided. An appropriate buffer material can be mounted in the bump-preventing buffer space; such buffer material is not an important feature of the present invention and not to be detailed hereinafter. By the present invention, the miniaturized fan module can be prevented from bumping against the server framework due to vibration generated in practical operation, without degrading a heat dissipating effect and structural strength of the fan module.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

A preferred embodiment of a miniaturized fan module proposed in the present invention is described in detail as follows with reference to FIGS. 2A to 2B.

Figure 1:
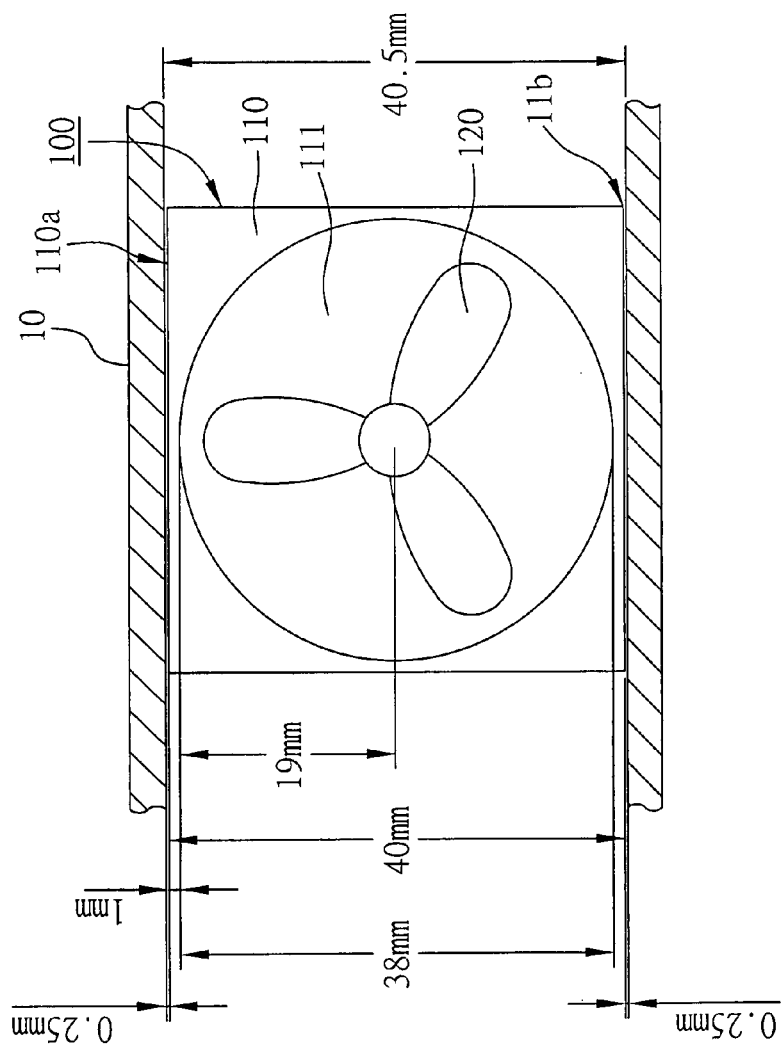
FIG. 1 (PRIOR ART) is a schematic cross-sectional view showing a conventional fan module assembled to a server framework.
Figure 2A:
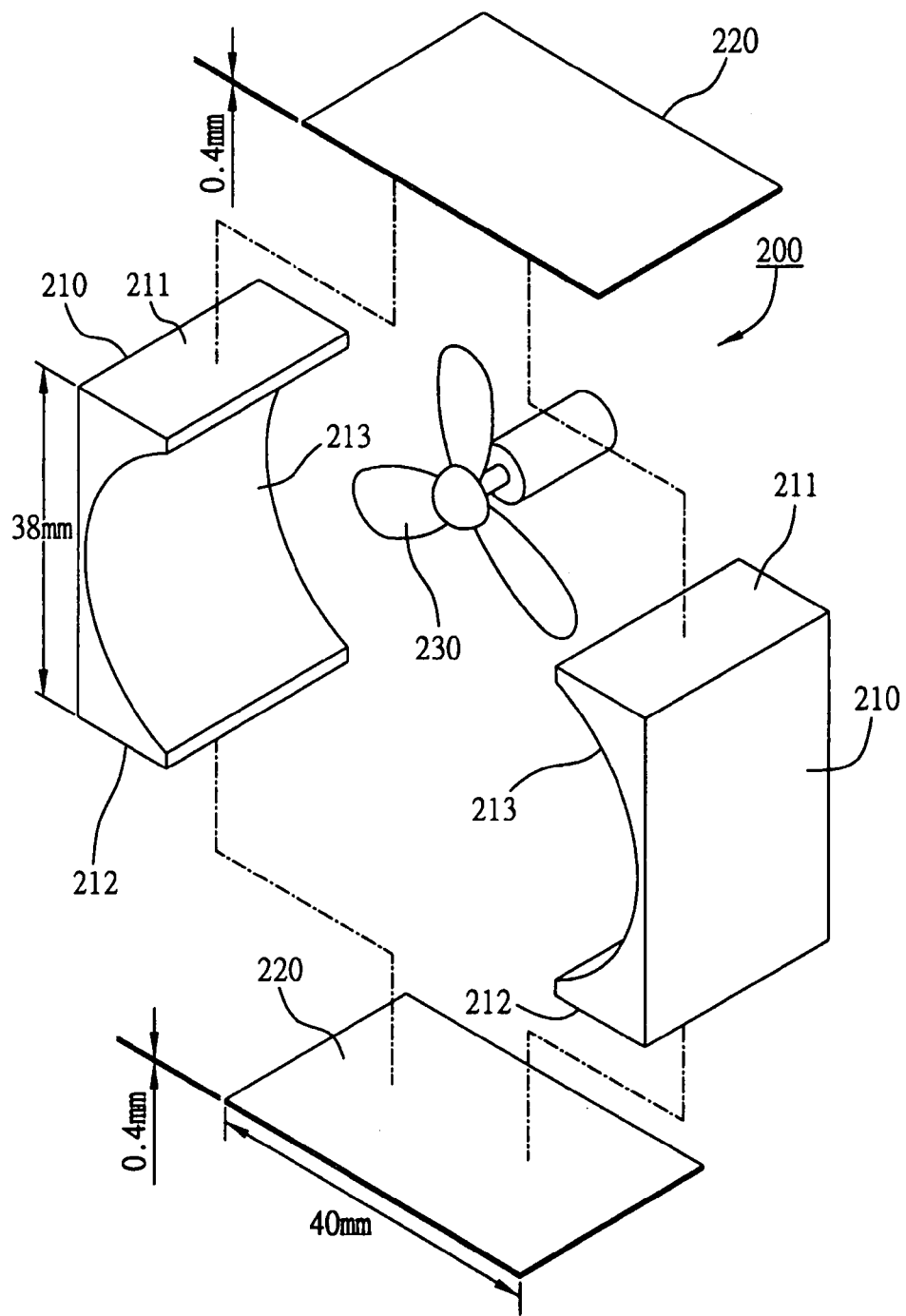
FIG. 2A is an exploded schematic diagram showing components before assembly of a miniaturized fan module in accordance with a preferred embodiment of the present invention.

FIG. 2A is an exploded schematic diagram showing components before assembly of the miniaturized fan module 200 in the present invention. As shown in FIG. 2A, the miniaturized fan module 200 comprises: (a) a pair of outer frames 210; (b) a pair of strengthening members 220; and (c) a fan unit 230.

Each of the outer frames 210 comprises a first surface 211 and a second surface 212, wherein an inner wall 213 is formed between the first surface 211 and the second surface 212 of each of the outer frames 210. The inner wall 213 can be shaped as a cambered inner wall shown in FIGS. 2A and 2B or a planar inner wall 213' shown in FIG. 3. Besides, may other structures or configurations are also suitable for the inner wall 213. During assembly, the two outer frames 210 are spaced apart by a predetermined distance face to face to cooperatively form a fan accommodating space 214 between the inner walls 213 of the two outer frames 210 for accommodating fans of the fan module 200 (if the inner wall 213 is shaped as a cambered inner wall, the fan accommodating space 214 is a cylinder-shaped space). In this embodiment, the width of the assembled two outer frames 210 is still 40 mm, whereas the height thereof is 38 mm.

The strengthening members 220 such as strengthening plates are preferably made of a vibration absorbing material having high structural strength and a high buffer property, such as a magnesium alloy. During assembly, the two strengthening members 220 are respectively secured to the first surfaces 211 and the second surfaces 212 of the two outer frames 210 to bridge the outer frames 210, such that the two outer frames 210 are coupled together by the strengthening members 220. In this embodiment, the width of each of the strengthening members 220 is for example 40 mm, and the thickness thereof is 0.4 mm.

Figure 2B:
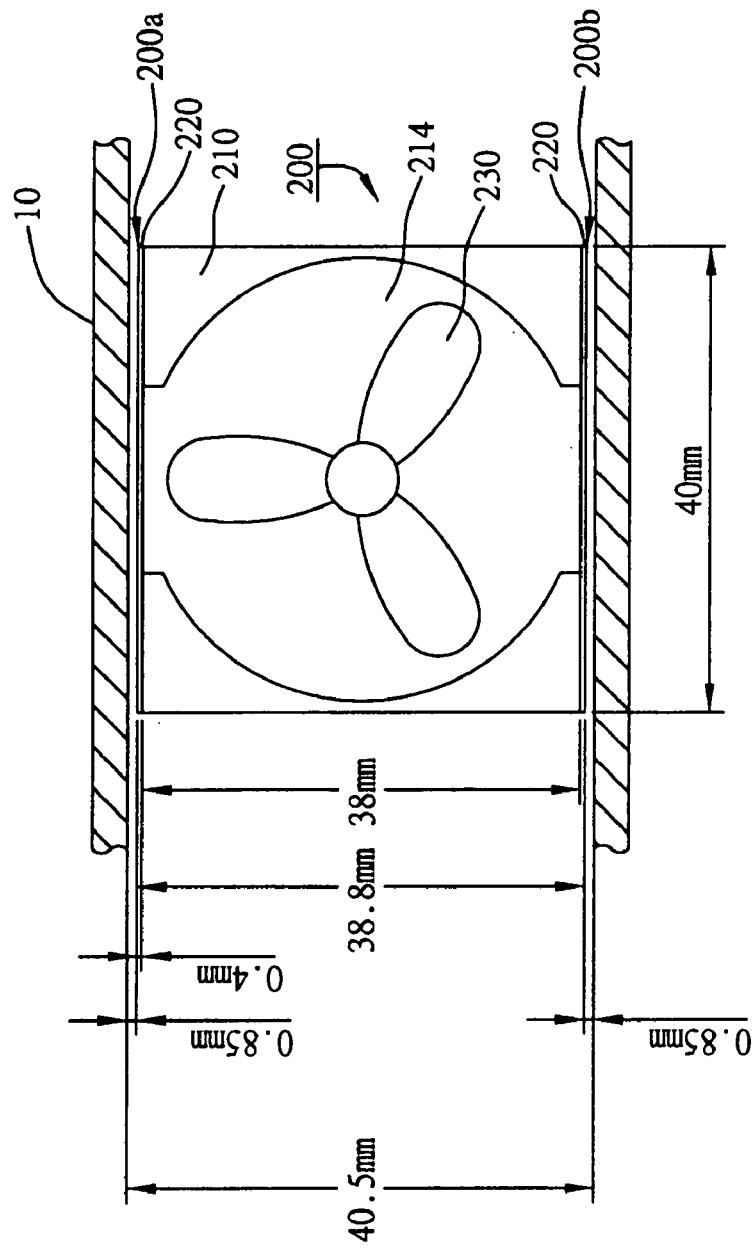
FIG. 2B is a schematic cross-sectional view showing the miniaturized fan module assembled to a server framework.
Figure 3:
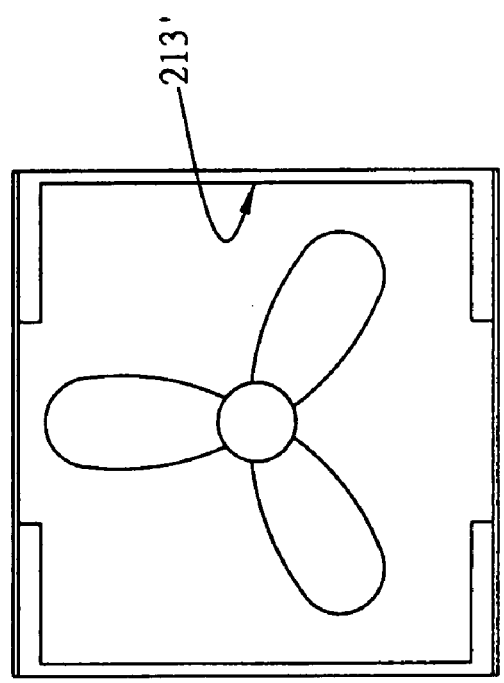
FIG. 3 is a schematic cross-sectional view showing outer frames of the miniaturized fan module in accordance with another preferred embodiment of the present invention.

The fan unit 230 is disposed in the fan accommodating space 214 (as shown in FIG. 2B) formed between the outer frames 210 coupled together by the strengthening members 220, so as to provide winds.

As shown in FIG. 2B, the height of the assembled miniaturized fan module 200 in the present invention is only 38.8 mm. When the miniaturized fan module 200 is mounted to the server framework 10, a distance between a top surface 200a or bottom surface 200b of the miniaturized fan module 200 and the server framework 10 is 0.85 mm. As such distance of 0.85 mm is much greater than the distance of 0.25 in the prior art, a much larger bump-preventing buffer space is provided between the fan module 200 in the present invention and the server framework 10, such that the fan module 200 can be prevented from bumping against the server framework 10 due to vibration generated in practical operation.

Therefore, the present invention provides a miniaturized fan module, which is assembled to a framework of an electronic system, such as a server framework, so as to provide a fan-type heat dissipating function to the server. The miniaturized fan module has a smaller structural size than that of a conventional fan module, such that a larger bump-preventing buffer space between the miniaturized fan module and the server framework is provided for preventing the fan module from bumping against the server framework due to vibration generated in practical operation, without degrading a heat dissipating effect and structural strength of the fan module. Consequently, the miniaturized fan module in the present invention provides better improvement and practicability than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A miniaturized fan module for being assembled to a framework of an electronic system, the miniaturized fan module comprising:
    a pair of outer frames, each of the outer frames comprising a first surface and a second surface, wherein an inner wall is formed between the first surface and the second surface of each of the outer frames, and the two outer frames are spaced apart by a predetermined distance face to face to cooperatively form a fan accommodating space between the inner walls thereof;
    a pair of strengthening members respectively secured to the first surfaces and the second surfaces of the two outer frames to bridge the outer frames, such that the two outer frames are coupled together by the strengthening members; and
    a fan unit disposed in the fan accommodating space formed between the two outer frames coupled together by the strengthening members, so as to provide winds.

2. The miniaturized fan module as claimed in claim 1, wherein the electronic system is a server.

3. The miniaturized fan module as claimed in claim 1, wherein the strengthening members are made of a vibration absorbing material.

4. The miniaturized fan module as claimed in claim 3, wherein the vibration absorbing material is a magnesium alloy.

5. The miniaturized fan module as claimed in claim 1, wherein the inner wall formed between the first surface and the second surface of each of the outer frames is a cambered inner wall.

6. The miniaturized fan module as claimed in claim 1, wherein the inner wall formed between the first surface and the second surface of each of the outer frames is a planar inner wall.

* * * * *